United States Patent [19]

Towell

[11] 3,842,190

[45] Oct. 15, 1974

[54] WIRE ROUTING SYSTEM

[75] Inventor: LeRoy Dean Towell, Dallas, Tex.

[73] Assignee: Computer Industries, Inc., Sherman Oaks, Calif.

[22] Filed: Sept. 22, 1971

[21] Appl. No.: 182,916

Related U.S. Application Data

[62] Division of Ser. No. 885,025, Dec. 15, 1969, Pat. No. 3,643,133.

[52] U.S. Cl. .............. 174/68.5, 29/625, 317/101 B, 317/101 CC

[51] Int. Cl. ........................... H05k 1/02, H05k 3/32

[58] Field of Search ...... 174/68.5, 72 A; 317/101 B, 317/101 C, 101 CC, 101 CM, 101 A, 122; 339/17 C, 17 CF; 29/625, 626

[56] References Cited

UNITED STATES PATENTS

| | | | |
|---|---|---|---|
| 3,431,350 | 3/1969 | Haberecht | 317/101 CC X |
| 3,538,389 | 11/1970 | Levesque et al. | 317/101 CC |
| 3,566,190 | 2/1971 | Huebner et al. | 317/101 DH |
| 3,605,063 | 9/1971 | Stewart | 317/101 CM X |

*Primary Examiner*—Darrell L. Clay

[57] ABSTRACT

A wire routing system for use with reflow wiring machines is disclosed in which the system includes a single-sided printed circuit board having a plurality of wire land pads and integrated circuit pads located thereon. Wire routing fixtures are also adapted to be positioned on the circuit board with each fixture including an elongated base plate having a plurality of upwardly extending posts longitudinally spaced thereon. Each of the posts includes a hook portion for receiving portions of insulated wire used for interconnecting the wire land pads. The wire routing is done with a conventional reflow wiring machine having a capillary which is adapted to lead the insulated wire from soldered joints on the land pads around adjacent hook portions in a simple and repeatable route. The integrated circuit pads, each of which is electrically connected to a corresponding wire land pad, are adapted to receive and be reflow soldered to the legs of dual inline packages which extend over the wire routing fixtures without any interference therebetween. As a result, a known and repeatable wire route is provided to facilitate the programming and inspection of the finished circuit on the circuit board.

4 Claims, 3 Drawing Figures

WIRE ROUTING SYSTEM

This is a division of application Ser. No. 885,025 filed Dec. 15, 1969, now U.S. Pat. No. 3,643,133 issued on Feb. 15, 1972.

BACKGROUND OF THE INVENTION

1. Field of the Invention

The present invention relates to reflow wiring systems for random interconnection of selected areas on printed circuit boards.

2. Description of the Prior Art

Heretofore, printed circuit boards came in a variety of configurations. Many types utilize multi-layer boards which necessitates the use of eyelets, and punched or plated passages through which buses or the like extend for interconnecting the circuits. However, such multi-layer configurations are quite complex and do not easily lend themselves to automated production applications.

This complexity is greatly simplified with the advent of "Numerically-Controlled" (NC) wiring systems which have eliminated the need for multi-layer boards. One such NC wiring system used successfully utilizes a system for random interconnection of selected areas on a single printed board by providing means for handling, locating and reflow soldering insulated wire to these selected areas on the printed circuit board. With such a process it is possible to produce almost any circuit from one basic board layout.

Basic components of the NC process include a special reflow soldering capillary through which the insulated wire is passed, and an alternating-current power supply for pulse heating the capillary. A tip support system for applying a controlled force to the capillary during the soldering cycle; and a wire feed and support system are also included in the basic components.

In operation, the capillary with insulated wire in place, is brought into contact with a land area on the printed circuit board. The alternating-current power supply heats the capillary for a predetermined amount of time, which vaporizes the insulation on the wire and causes the solder on the printed circuit board to melt and flow around the exposed wire. After cooling, the capillary is raised from the board with the insulated wire passing through it, thereby enabling the capillary to serve as a wire guide for stringing the wire to subsequent pads for soldering.

Although such a system is a vast improvement over prior production equipment, the system still suffers from various shortcomings which severely limit its utilization.

A major problem encountered is that when a complex circuit is produced by the NC programmed system on a printed circuit board, the stringing of the wire is routed and rerouted over the various land pads in such a manner that a scrambled hodgepodge of wires is produced which is very hard to follow or unscramble. The problem is especially acute when a design change necessitates a rerouting of the wire after the circuit has been produced. With such a system it is virtually impossible to locate the desired connections to change them.

Moreover, the dual inline packages used in such systems are located on the opposite sides of the circuit board on which the wire routing is located. As a result, these packages must be mounted on plugs equipped with long rods which extend through eyelets or plated passages for connection with the land pads. Moreover, these connections are made in such a manner that they interfere with any visual inspection of the wire routing. In case of malfunction, therefore, the plugs must be disconnected and removed, which, of course, is arduous and undesirable. As a result, it is virtually impossible to repair any malfunctions occurring on the circuit board, and as a general rule, when a malfunction occurs, the entire board is discarded.

SUMMARY OF THE INVENTION

The present invention obviates the above-mentioned shortcomings by providing an NC reflow wiring system that includes means for greatly simplifying the routing of insulated wire over a printed circuit board in order to make the routing repeatable and repairable.

The novel reflow wiring system includes a plurality of wire land pads and integrated circuit pads located thereon. Wire routing fixtures are also positioned on the printed circuit board, with each fixture comprising an elongated base plate having a plurality of upwardly extending posts longitudinally spaced on both side edges of the base plate. Each of the posts includes a hook portion for receiving portions of the insulated wire which interconnects the wire land pads. The wire routing is done with a conventional NC reflow wiring machine having a capillary which is adapted to lead the wire from soldered joints on the land pads around adjacent hook portions in a simple and repeatable route. The width of the hook portions are dimensioned in such a manner that the lateral edges on each hook portion coincide with each adjacent pair of wire land pads to enable the wire interconnecting the pads to approach the lateral edges of each hook portion at right angles thereto.

The integrated circuit pads, each of which is electrically connected to a corresponding wire land pad, are adapted to receive and be reflow soldered to the legs of the dual inline packages. The wire routing fixtures are of a size to permit the packages to extend over them without interference.

A very important advantage of the system is that the fixtures permit the NC wire routing to be accomplished in such a manner that all the solder joints and pads remain exposed for inspection and repair after the wiring is completed.

Furthermore, the fixtures particularly lend themselves to automated NC process and equipment. With such devices, the position of all the connections are known, the wire routes are greatly simplified, and rerouting can be easily accomplished.

Another advantage of the novel system is that the wiring and the dual inline packages are located on the same side of the circuit board, thereby eliminating the need for mounting plugs with connections extending through the circuit board. Moreover, the dual inline packages and the power buses are soldered to the integrated circuit pads, making the connections simple and inexpensive.

The features of the present invention which are believed to be novel are set forth with particularity in the appended claims. The present invention, both as to its organization and manner of operation, together with further objects and advantages thereof, may best be understood by reference to the following description, taken in connection with the accompanying drawings.

DESCRIPTION OF THE PREFERRED EMBODIMENT

Figure 1:
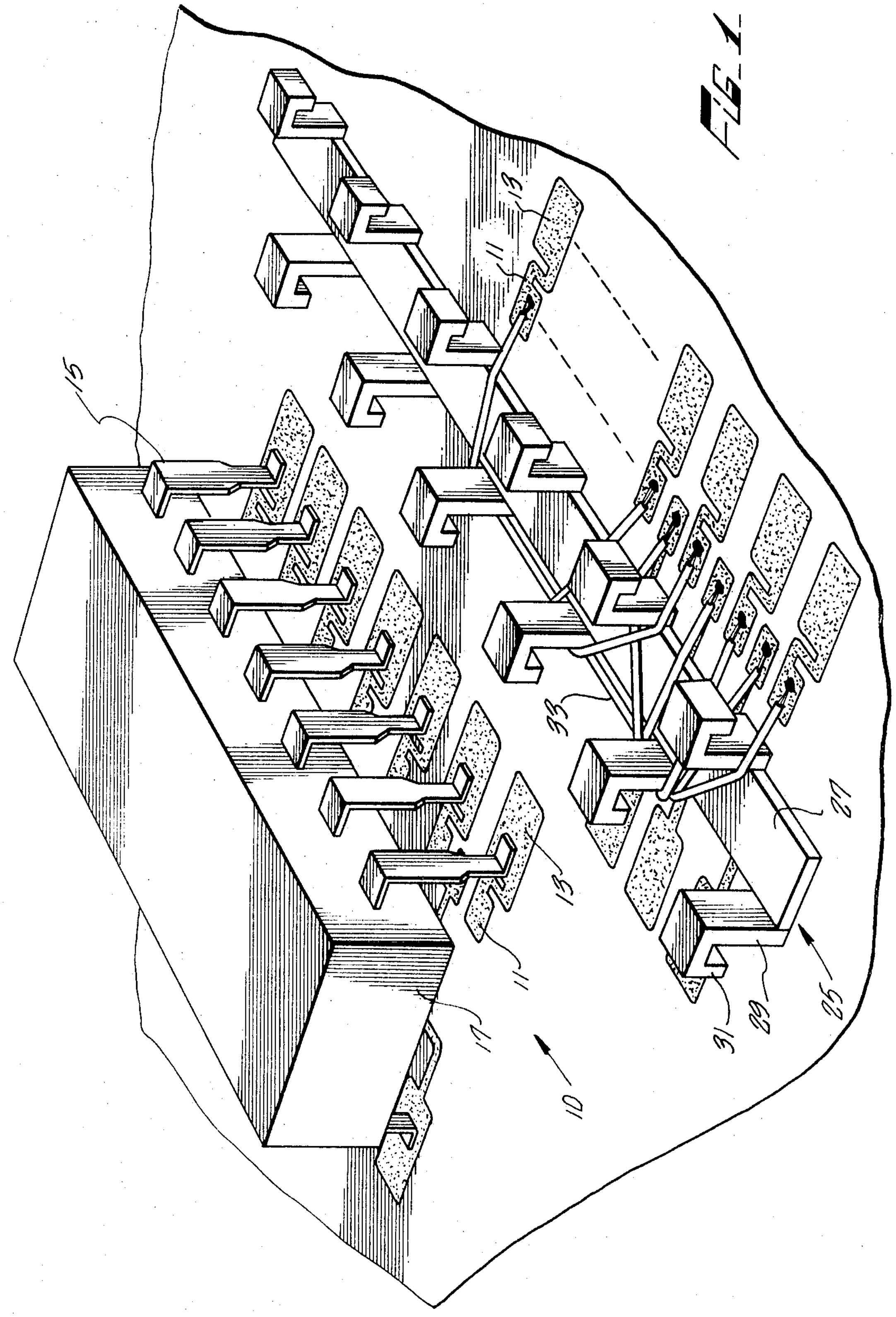
FIG. 1 is a perspective view of a printed circuit board having a novel wire-routing system located thereon.

Referring now to the drawings, FIG. 1 shows a circuit board, generally indicated by arrow 10, having a printed circuit pattern located thereon. The printed circuit pattern consists of a plurality of wire land areas 11 and integrated circuit pads 13. The land areas 11 are arranged in longitudinal rows and are alternately connected to the integrated circuit pads 13 formed in two longitudinal rows on both sides thereof. Each of the land areas 11 includes a quantity of reflow soldering material on its surface which is adapted to be heated by the capillary (not shown) when in contact with a portion of insulated wire, to form a solder joint therewith. Each of the integrated circuit pads 13 likewise include a quantity of reflow solder material located on the surface for forming a solder joint with the legs 15 of the dual inline package 17 and the tabs 19 of a power bus 21. The dual inline package 17 and the power bus 21 will be described in greater detail hereinafter.

A wire-routing fixture 25 is located adjacent each row of land areas 11 and includes an elongated base plate 27 mounted on the surface of the printed circuit board 10. A plurality of upwardly extending posts 29 are alternately spaced on both sides of the plate 27 along its entire length, with each of the posts 29 including a hook portion 31. Each post 29 is dimensioned such that lateral sides are laterally postioned between an adjacent pair of land areas 11.

A quantity of insulated wire 33 is adapted to be reflow soldered to any of the desired land areas 11 to interconnect selected land areas to form a circuit. The fixtures 25 are provided to enable the wire 33 to be routed about the posts 29 in between the solder connections made on the adjoining land areas 11. As can be seen, no matter which two land areas 11 are interconnected, the route of the wire 33 is in a straight line relationship with the fixtures 25 and the land areas 11. As stated previously, in the absence of the fixtures 25, the random interconnections between the land areas 11 would be made at a multitude of angles which would result in a scrambled conglomeration of wire. According to the present invention, the routing is a simple, straight line and easily ascertainable upon inspection.

Figure 2:
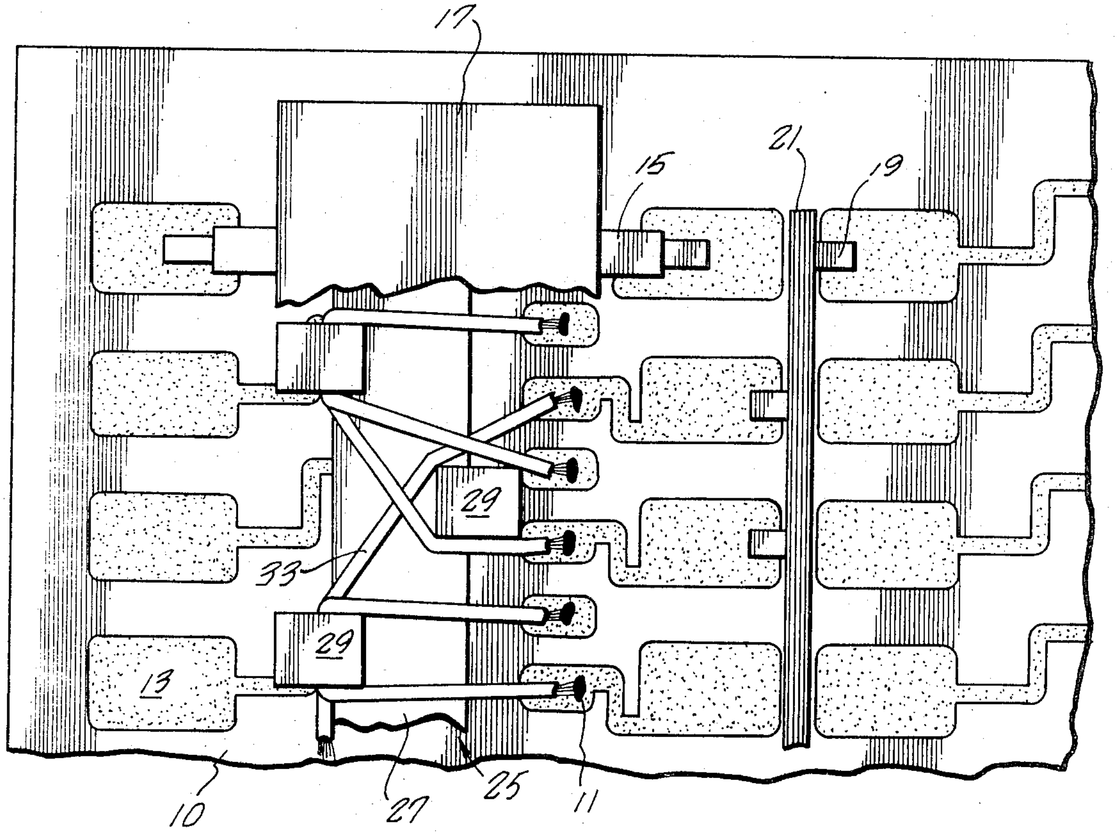
FIG. 2 is a fragmentary plan view of the printed circuit board in accordance with the present invention.
Figure 3:
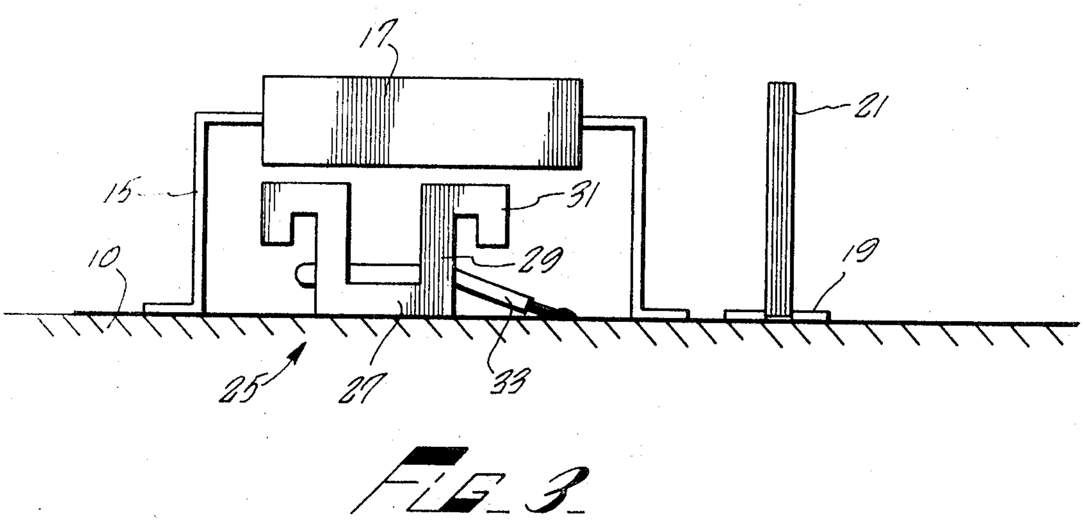
FIG. 3 is a sectional view of the printed circuit board taken along lines 3—3 of FIG. 2.

FIG. 2 more clearly illustrates the dimensions of the posts 29. As can be seen, the lateral edges of each post extend to the midpoint of each adjoining pair of land areas 11 to enable the wire 33 soldered thereon to extend to a respective post 29 at a 90° angle therewith. Although these dimensions are not required, it is preferred, especially since the routing is done in combination with an NC X-Y movable table, the operation of which will be described in greater detail hereinafter.

Because of the lateral spacing of the integrated circuit pads 13, each dual inline package 17 is adapted to extend over the wire routing and the wire fixture 25 without interference. For visual inspection of the wire routing, the packages 17 can be easily disconnected and removed to allow for visual access to the routing. An important advantage of such a board layout is that all the connections are made on one side of the board, thereby eliminating multi-layered boards with all of their previously mentioned shortcomings. Moreover, since the packages 17 are on the same side of the board as the wire routing, the need for a mounting plug for the packages to extend through the board is eliminated.

Each of the power buses 21 typically consist of a ground and voltage plate 35 and 37, respectively, sandwiched between three insulating plates 39. The tabs 19 are connected to the plates 35 and 37 and are positioned along the length thereof for connection to any desired integrated circuit pad.

In assembling the printed circuit board, the circuit board 10 is adapted to be placed on an X-Y table of a conventional NC reflow wiring machine (not shown). The NC reflow wiring machine also typically includes a capillary which is adapted to handle and bring the insulated wire 33 into contact with a land area 11. An alternating current power supply then heats the capillary for a predetermined amount of time to vaporize the insulation on the wire 33 and cause the solder on the land area 11 to melt and flow around the exposed wire. After the solder joint is completed and cooled, the capillary is raised from the board with the insulated wire passing through it. The table is then moved laterally in the X axis to permit the capillary to lead the wire 33 around an adjoining post 29 and underneath the respective hook portion 31. The table is then moved along the Y axis a desired amount to a post 29 adjacent a wire land area 11 which is desired to interconnect. The capillary is again lowered to enable the wire 33 to extend under the hook portion 31 of the last mentioned post 29. The table is finally moved in the X direction to enable the capillary to lead the wire 33 to the adjacent land area 11 for the solder connection. This process is again repeated for other connections until the desired circuit is complete, a representative circuit being shown in FIG. 1.

As can be seen, the entire routing can be easily programmed on the wiring machine. Moreover, if a desired change in the circuit is necessary, this can easily be effectuated by NC reprogramming, since the position of the joints and the wire routing is known at all times.

As a result, a greatly simplified wire routing system is provided on a novel printed circuit board to enable the wire routing to be made that is repeatable and repairable.

It should be noted that various modifications can be made to the apparatus while still remaining within the purview of the following claims.

What is claimed is:

1. A wire routing printed circuit board for use with an NC reflow wiring machine having a capillary which is adapted to handle, locate and reflow solder insulated wire to selected areas and to support electronic components, said circuit board comprising:

a printed circuit board base having at least one group of wire land areas printed on the one side thereof for providing electrical connections with portions of said insulated wire, said group of wire land areas being aligned in a single longitudinal row and having a quantity of electrically conductive solder material mounted on each wire land area;

a plurality of integrated circuit pads having a quantity of electrically conductive solder material mounted on each pad and located on said base for receiving the terminal legs of a plurality of electronic components, said integrated circuit pads comprising at least a pair of longitudinal rows of integrated circuit pads with a respective row of integrated circuit pads being on either side of said wire land area row, each integrated circuit pad being electrically connected to a respective one of said wire land area located in said single longitudinal wire land row, said wire land areas and said integrated circuit pads being arranged in a coordinate system on said base, said printed circuit board further having space to receive alignment means for aligning lengths of said insulated wire to extend in accordance with a predetermined design between said wire land areas to provide a known and repeatable insulated wire route for facilitating the programming and inspection of the finished circuit.

2. The invention of claim 1 wherein said wire land areas are smaller in area than said integrated circuit pads.

3. The invention of claim 1 wherein said wire land areas are alternatively connected to said integrated circuit pads on either side of said wire land areas.

4. The invention of claim 3, wherein each row of wire land areas and integrated circuit pads are parallel.

* * * * *